United States Patent
Tabata

(10) Patent No.: US 7,847,390 B2
(45) Date of Patent: Dec. 7, 2010

(54) SEMICONDUCTOR DEVICE

(75) Inventor: Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 346 days.

(21) Appl. No.: 12/145,795

(22) Filed: Jun. 25, 2008

(65) Prior Publication Data
US 2009/0146277 A1   Jun. 11, 2009

(30) Foreign Application Priority Data
Dec. 11, 2007   (JP) .............................. 2007-319794

(51) Int. Cl.
H01L 23/52  (2006.01)
H01L 23/48  (2006.01)

(52) U.S. Cl. .............................. 257/692; 257/E23.031; 257/674; 257/690; 361/704

(58) Field of Classification Search .......... 257/E23.031, 257/E23.03, 674, 668, 669, 690–692, 704, 257/718, 722, 723, 736, 784; 361/704, 707, 361/715, 717; 174/52.2, 52.4, 16.3
See application file for complete search history.

(56) References Cited

U.S. PATENT DOCUMENTS

| | | | | | |
|---|---|---|---|---|---|
| 5,398,160 | A | * | 3/1995 | Umeda | 361/707 |
| 5,444,297 | A | * | 8/1995 | Oshima et al. | 257/691 |
| 5,521,437 | A | * | 5/1996 | Oshima et al. | 257/701 |
| 5,559,374 | A | * | 9/1996 | Ohta et al. | 257/723 |
| 5,585,672 | A | * | 12/1996 | Koike et al. | 257/707 |
| 5,621,243 | A | * | 4/1997 | Baba et al. | 257/712 |
| 5,703,399 | A | * | 12/1997 | Majumdar et al. | 257/723 |
| 5,767,573 | A | * | 6/1998 | Noda et al. | 257/675 |
| 5,920,119 | A | * | 7/1999 | Tamba et al. | 257/718 |
| 5,942,797 | A | * | 8/1999 | Terasawa | 257/723 |
| 6,201,696 | B1 | * | 3/2001 | Shimizu et al. | 361/704 |
| 6,885,097 | B2 | * | 4/2005 | Maeno et al. | 257/698 |
| 6,943,443 | B2 | * | 9/2005 | Nobori et al. | 257/704 |
| 7,149,088 | B2 | * | 12/2006 | Lin et al. | 361/704 |
| 7,208,833 | B2 | * | 4/2007 | Nobori et al. | 257/704 |

FOREIGN PATENT DOCUMENTS

| | | |
|---|---|---|
| DE | 103 40 297 B4 | 7/2006 |
| JP | 5-275872 | 10/1993 |
| JP | 6-188045 | 7/1994 |
| JP | 7-211363 | 8/1995 |
| JP | 10-189108 | 7/1998 |

(Continued)

*Primary Examiner*—Chris Chu
(74) *Attorney, Agent, or Firm*—Oblon, Spivak, McClelland, Maier & Neustadt, L.L.P.

(57) ABSTRACT

A semiconductor device includes: a semiconductor module case; a metal terminal externally extending from within the case; a semiconductor element disposed within the case and electrically connected to the metal terminal; and a printed wiring board having a wiring pattern formed on a surface thereof, the printed wiring board being connected to the semiconductor element through the metal terminal; wherein the external portion of the metal terminal includes a joining portion and a resilient portion, the joining portion being in surface contact with an external surface of the case, the resilient portion facing and being spaced from the joining portion; wherein the printed wiring board is inserted between the joining portion and the resilient portion; and wherein the wiring pattern on the printed wiring board is pressure-welded to the joining portion.

12 Claims, 7 Drawing Sheets

FOREIGN PATENT DOCUMENTS

| JP | 2002-25720 | 1/2002 |
| JP | 2002-501291 | 1/2002 |
| JP | 2002-93480 | 3/2002 |
| JP | 2002-246770 | 8/2002 |
| JP | 2007-35291 | 2/2007 |

* cited by examiner

SEMICONDUCTOR DEVICE

BACKGROUND OF THE INVENTION

1. Field of the Invention

The present invention relates to a semiconductor device in which a semiconductor module and a separate printed wiring board are interconnected in a simple manner by terminals extending from the semiconductor module.

2. Background Art

It is common for semiconductor modules, such as IGBT (Insulated Gate Bipolar Transistor) modules and IPMs (Intelligent Power Modules), to have externally extending terminals. These terminals are used to electrically connect a semiconductor element or elements contained in the semiconductor module to an external wiring board. Examples of such a wiring board include PCBs (Printed Circuit Boards). The present invention is directed to semiconductor devices of the type in which a semiconductor module and a printed wiring board are interconnected by terminals extending from the semiconductor module.

In such semiconductor devices, the printed wiring board is preferably connected to the externally extending terminals of the semiconductor module with the lowest possible contact resistance. Therefore, it is common to connect the printed wiring board to these terminals by means of screws or solder in order to firmly couple them together.

Prior art includes JP-A-5-275872, JP-A-2002-25720, JP-A-10-189108, JP-A-2002-246770, JP-A-7-211363, JP-A-2002-93480, JP-A-2007-35291, JP-A-6-188045, and JP-A-2002-501291 (PCT).

However, the use of solder is not environmentally friendly and hence should preferably be avoided. Further, it is also preferable to avoid the use of screws when the printed wiring board must be connected to a large number of terminals of the semiconductor module, since in such a case the screw fastening takes considerable labor and time. To circumvent this problem, the printed wiring board may be connected to a reduced number of terminals of the semiconductor module with the addition of springs. This, however, may cause the applied compressive force to be concentrated where the terminals are fastened to the printed wiring board by the screws, or may reduce the overall contact force between the terminals and the printed wiring board, resulting in contact failure. Furthermore, the use of springs means an increased number of connections, which may result in an increase in the contact resistance. Further, fixing the printed wiring board to the terminals by the application of compressive force in the manner as described above results in constant exertion of stress on the board, which is not desirable.

Thus, the use of screws alone for connecting the printed wiring board and the terminals of the semiconductor module is disadvantageous in that the screw fastening takes considerable labor and time and, furthermore, the compressive fastening force is locally exerted on those portions of the board around the screws. The use of solder is disadvantageous in that it is not environmentally friendly. Further, the use of springs may result in reduced contact force and hence increased contact resistance at the connections where the printed wiring board is connected to the terminals of the semiconductor module.

SUMMARY OF THE INVENTION

The present invention has been devised to solve these problems. It is, therefore, an object of the present invention to provide a semiconductor device in which a semiconductor module and a separate printed wiring board are interconnected in a simple manner by terminals extending from the semiconductor module without using solder or screws so as not to cause great stress on the printed wiring board while ensuring sufficiently low contact resistance between the board and the terminals.

According to one aspect of the present invention, A semiconductor device includes a semiconductor module case, a metal terminal externally extending from within the case, a semiconductor element disposed within the case and electrically connected to the metal terminal, and a printed wiring board having a wiring pattern formed on a surface thereof, the printed wiring board being connected to the semiconductor element through the metal terminal. The external portion of the metal terminal includes a joining portion and a resilient portion. The joining portion being in surface contact with an external surface of the case. The resilient portion facing and being spaced from the joining portion. The printed wiring board is inserted between the joining portion and the resilient portion. The wiring pattern on the printed wiring board is pressure-welded to the joining portion.

According to another aspect of the present invention, a semiconductor device includes a semiconductor module case, a metal terminal externally extending from within the case, a semiconductor element disposed within the case and electrically connected to the metal terminal, and a printed wiring board having a wiring pattern formed on a surface thereof, the printed wiring board being connected to the semiconductor element through the metal terminal. The external portion of the metal terminal includes a resilient portion that faces and is spaced from the case. The printed wiring board is inserted between the resilient portion and the case. The wiring pattern on the printed wiring board is pressure-welded to the resilient portion.

Other and further objects, features and advantages of the invention will appear more fully from the following description.

DETAILED DESCRIPTION OF THE PREFERRED EMBODIMENTS

First Embodiment

Figure 1A:
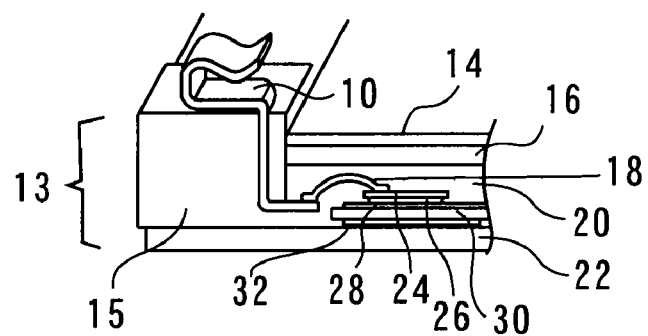
FIG. 1A is a diagram illustrating the configurations of the semiconductor module and an externally extending terminal according to first embodiment.
Figure 1B:
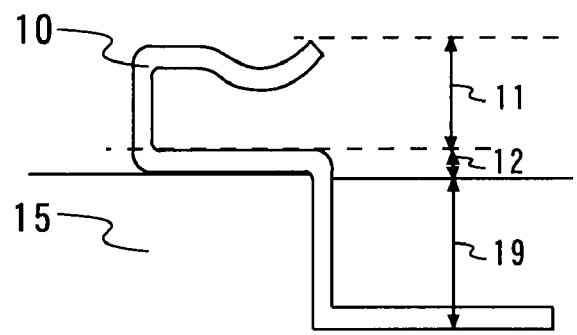
FIG. 1B is an enlarged detailed side view of the externally extending terminal.
Figure 1C:
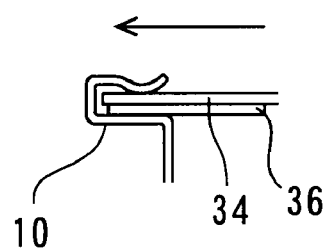
FIG. 1C is a diagram illustrating the fixing of the printed wiring board into the terminal.
Figure 1D:
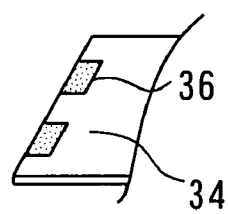
FIG. 1D is a diagram illustrating a wiring pattern on the printed wiring board.

A first embodiment of the present invention relates to a semiconductor device in which a semiconductor module and a printed wiring board are interconnected by simple interconnection means. This semiconductor device is shown in FIGS. 1A to 1D. FIG. 1A is a diagram illustrating the configurations of the semiconductor module 13 and an externally extending terminal 10 thereof. FIG. 1B is an enlarged detailed side view of the externally extending terminal 10. FIG. 1C is a diagram illustrating the fixing of the printed wiring board 34 into the terminal 10. FIG. 1D is a diagram illustrating a wiring pattern 36 on the printed wiring board 34. It should be noted that FIGS. 1A and 1B do not show the printed wiring board 34 for simplicity.

As shown in FIG. 1A, the semiconductor device of the present embodiment includes the semiconductor module 13 and the metal terminal 10 extending from within the semiconductor module 13. The semiconductor module 13 includes a module case 15 containing semiconductor elements, etc., and is electrically connected to an external component(s) (e.g., the printed wiring board 34). The semiconductor module 13 also includes a base plate 22 mounted on its bottom. The base plate 22 has a flat lower surface in contact with which heat dissipation means (now shown), such as cooling fins, are mounted. The heat generated from the semiconductor elements (described later) is distributed throughout the base plate 22 and transferred to the heat dissipation means. It should be noted that the base plate 22 may be omitted if the heat of the semiconductor elements need not be dissipated from the module 13.

An insulating plate 30 lies above the base plate 22 (i.e., on the side of the base plate 22 opposite to the bottom surface of the semiconductor module 13). It is common for the insulating plate 30 to be coated with a metal film and soldered to the base plate 22. However, it may be enough to place them in contact with each other with a grease therebetween. According to the present embodiment, the insulating plate 30 is bonded to the base plate 22 by solder 32.

A circuit wiring pattern 28 is formed on the side of the insulating plate 30 opposite to the base plate 22, and a semiconductor element 24 is connected to the circuit wiring pattern 28 by solder 26. The circuit wiring pattern 28 and the semiconductor element 24 are wire-bonded to the metal terminal 10 by aluminum wire bonds, etc. Alternatively, the circuit wiring pattern 28 may be bonded to the metal terminal 10 by soldering or ultrasonic bonding, etc. FIG. 1A shows by way of example that the semiconductor element 24 is connected to the metal terminal 10 by an aluminum wire 18. Thus, the components within the semiconductor module 13 are connected to the metal terminal 10 as necessary.

In the manufacture of the semiconductor device, after the semiconductor element 24 and other components have been wire-bonded, etc. as required, specific areas within the module case 15 are filled with a filler 20 of a resin, etc. A cover 14 is then mounted above the filler 20 with a predetermined space 16 therebetween to protect the module case 15 as well as the semiconductor element 24.

The metal terminal 10 connected to the semiconductor element 24, etc. by the aluminum wire 18 extends from the inside to the outside of the semiconductor module 13. The following describes the configuration of the metal terminal 10 with reference to FIG. 1B. FIG. 1B is a side view of the metal terminal 10 of the present embodiment. The entire metal terminal 10 is integrally formed of a resilient metal material and may be divided into three distinct portions: the portion extending within the semiconductor module 13 (hereinafter referred to as the "internal terminal 19"); the portion laterally extending in surface contact with a surface of the module case 15 (hereinafter referred to as the "joining portion 12"); and the portion with a substantially L-shaped cross-section extending from the joining portion 12 (hereinafter referred to as the "resilient portion 11"). The joining portion (or welding portion) 12 has a flat plate-like shape, and the resilient portion (or spring portion) 11 includes a portion that faces and is spaced a predetermined distance from the joining portion 12 (see FIG. 1B).

The above portion of the resilient portion 11 facing the joining portion 12 is convexly curved downwardly (i.e., toward the joining portion 12). This curved portion of the resilient portion 11 is referred to in the appended claims as a "second side portion." The resilient portion 11 also includes a portion extending perpendicularly from the joining portion 12 and bridging between the joining portion 12 and the curved portion of the resilient portion 11. This bridge portion of the resilient portion 11 is referred to in the appended claims as a "first side portion."

Thus, the metal terminal 10 includes the internal terminal 19, the joining portion 12 extending from the internal terminal 19, and the resilient portion 11 extending from the joining portion 12. It should be noted that the resilient portion 11 and the joining portion 12 together form a U-shaped fixing member having an open side for receiving the printed wiring board 34.

FIG. 1C is a diagram illustrating the fixing of the printed wiring board 34 into the metal terminal 10. The printed wiring board 34 has formed thereon a wiring pattern 36 which is electrically connected to the semiconductor element 24 through the metal terminal 10 when the printed wiring board 34 is inserted into the U-shaped metal terminal 10 as indicated by the arrow in FIG. 1C. It should be noted that the distance between the joining portion 12 and the closest point of the curved portion of the resilient portion 11 is (slightly) smaller than the combined thickness of the printed wiring board 34 and the wiring pattern 36. Therefore, when the printed wiring board 34 is inserted between the resilient portion 11 and the joining portion 12 of the metal terminal 10 as shown in FIG. 1C, the resilient portion 11 causes slight stress on the printed wiring board 34.

FIG. 1D is a perspective view of the printed wiring board 34 with the wiring pattern 36 thereon. As shown in FIG. 1D, the wiring pattern 36 is formed on an edge of the printed wiring board 34 such that the pattern 36 comes into contact with the joining portion 12 of the metal terminal 10 when the printed wiring board 34 is inserted into the metal terminal 10 as shown in FIG. 1C. It should be noted that according to the present embodiment the force with which the printed wiring board 34 is clamped between the resilient portion 11 and the joining portion 12 of the metal terminal 10 is small and just large enough to ensure sufficient contact of the printed wiring board 34 with these portions.

Further, the wiring pattern 36 on the printed wiring board 34 is pressure-welded to the joining portion 12 of the metal terminal 10. Specifically, according to the present embodiment, when the printed wiring board 34 is inserted into the metal terminal 10 (as indicated by the arrow in FIG. 1C), the wiring pattern 36 slides over the surface of the joining portion 12 of the terminal 10 with friction and hence with heat generation which causes the wiring pattern 36 to be welded to the joining portion 12. (In other embodiments, however, any suitable pressure welding method may be used.)

This completes the description of the configuration of the semiconductor device of the present embodiment. Thus, according to the present embodiment, the wiring pattern 36 formed on the printed wiring board 34 is electrically connected to the semiconductor element 24 in the semiconductor module 13 through the metal terminal 10 by pressure-welding (or friction-welding) the wiring pattern 36 to the joining portion 12 of the metal terminal 10 (without using other fixing parts or reinforcing means). This ensures that the printed wiring board 34 is firmly fixed to the semiconductor module 13, thereby eliminating the need to secure the printed wiring board 34 to the metal terminal 10 by screws or by solder. Thus, the present embodiment provides a semiconductor device in which a semiconductor module and a separate printed wiring board are interconnected by simple interconnection means.

A conventional method for firmly securing the printed wiring board 34 between the resilient portion 11 and the joining portion 12 of the metal terminal 10 is to reduce the distance between the joining portion 12 and the closest point of the curved portion of the resilient portion 11 to a distance considerably smaller than the combined thickness of the printed wiring board 34 and the wiring pattern 36 formed thereon. However, this causes the printed wiring board 34 to be constantly subjected to stress from the resilient portion 11, which may result in damage to the board 34. The present embodiment eliminates the need for such a method. Specifically, according to the present embodiment, the printed wiring board 34 is firmly secured to the metal terminal 10 primarily by welding the wiring pattern 36 to the joining portion 12 of the metal terminal 10. The resilient force exerted on the printed wiring board 34 by the metal terminal 10 is small and just large enough to hold the board 34 in place. (That is, the resilient force does not contribute much to the fixing of the printed wiring board 34.) Therefore, the printed wiring board 34 is not constantly subjected to great stress, and damage thereto is avoided.

Further, when the wiring pattern 36 on the printed wiring board 34 is pressure-welded (or friction-welded) to the metal terminal 10, the pattern 36 is slid over (i.e., moved parallel to) the surface of the joining portion 12 of the terminal 10. This means that no excessive load or stress is placed on the metal terminal 10 at that time, eliminating the need for reinforcing means for reinforcing the metal terminal. Further, since the joining portion 12 of the metal terminal 10 is in surface contact with the module case 15 when the printed wiring board 34 is slid over the joining portion 12 (and thereafter), displacement of the terminal 10 from its original position hardly occurs.

For the same reason, the wiring pattern 36 on the printed wiring board 34 can be firmly pressure-welded (or friction-welded) to the joining portion 12 of the metal terminal 10.

Further, since the wiring pattern 36 is welded to the metal terminal 10, the contact resistance between them is reduced. It should be noted that when the semiconductor element 24 is a power device, the semiconductor device containing it must have a low resistance configuration. However, if, as in conventional arrangements, a member or members for fixing or reinforcing the metal terminal 10 are inserted between the semiconductor element 24 and the printed wiring board 34, the resistance from the semiconductor element 24 to the printed wiring board 34 increases due to contact resistance with these inserted members, resulting in degradation of the characteristics of the semiconductor device. On the other hand, as described above, the present embodiment eliminates the need for such fixing or reinforcing members and hence reduces the resistance of the semiconductor device by pressure-welding (or friction-welding) the wiring pattern 36 on the printed wiring board 34 to the joining portion 12 of the metal terminal 10. The present embodiment is especially advantageous when it is desired to interconnect a printed wiring board and a terminal that carries a current of approximately 200 A or less.

Although in the present embodiment the wiring pattern 36 on the printed wiring board 34 is welded to the joining portion 12 of the metal terminal 10, in other embodiments the side of the printed wiring board 34 opposite to the wiring pattern 36 may be welded to the resilient portion 11 of the metal terminal 10 in order to more firmly secure the printed wiring board 34 to the terminal 10. Thus, any suitable portion (including an area not bearing a wiring pattern) of the printed wiring board 34 may be welded to the metal terminal 10 to secure the printed wiring board 34 to the terminal 10.

Second Embodiment

Figure 2:
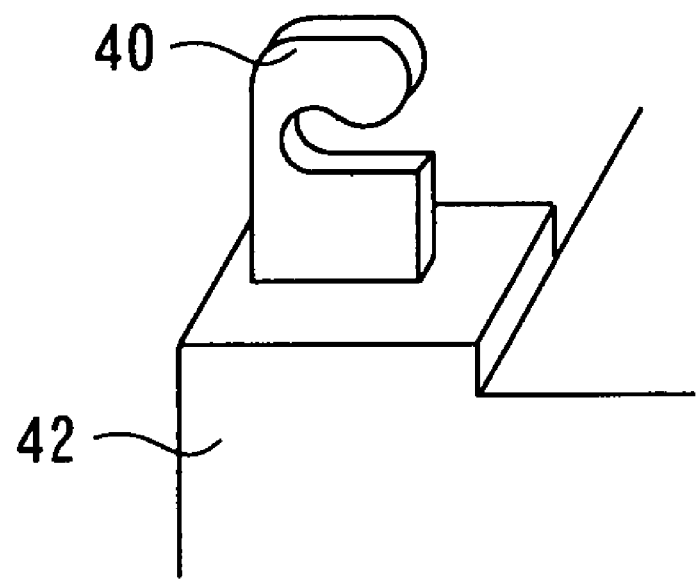
FIG. 2 shows a metal terminal and a semiconductor module case according to second embodiment.

A second embodiment of the present invention relates to a configuration of a metal terminal that can be manufactured by a simple process. FIG. 2 shows a metal terminal 40 and a semiconductor module case 42 according to the present embodiment. The metal terminal 40 is made of the same material as the metal terminal 10 of the first embodiment and similar to the terminal 10 except in shape. The metal terminal 40 is disposed to extend perpendicularly from a surface of the module case 42. This terminal is characterized in that its manufacture does not require a bending process. Specifically, the resilient portion and the joining portion of the metal terminal 40 are defined by a notch formed in the terminal. Therefore, this terminal can be manufactured by a simple process. Further, it is easy to form a notch of any desired shape in the terminal plate, resulting in increased freedom in designing the shape of the metal terminal.

Third Embodiment

Figure 3:
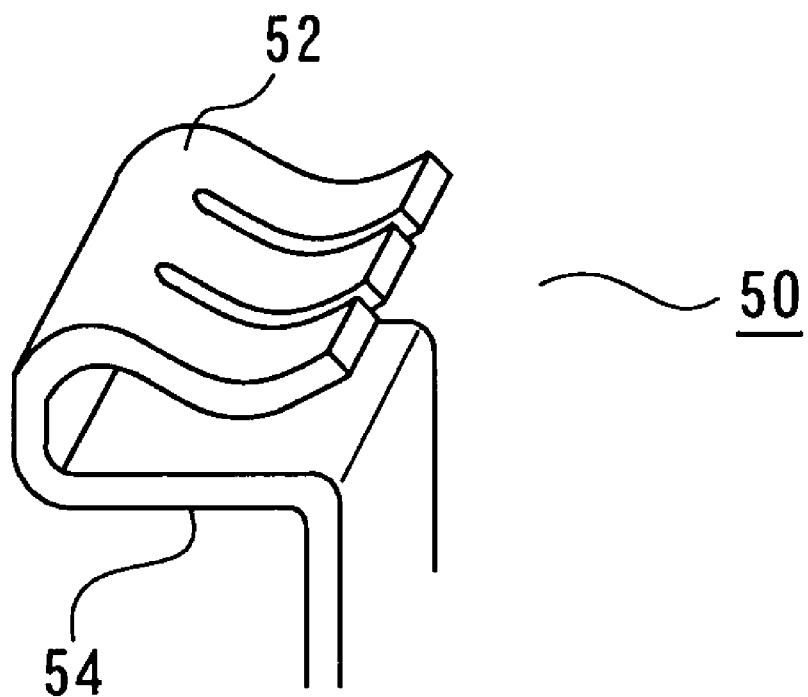
FIG. 3 is a perspective view of the metal terminal according to third embodiment.

A third embodiment of the present invention relates to a semiconductor device which differs from that of the first embodiment in that it includes a metal terminal 50 (described later) instead of the metal terminal 10. This metal terminal 50 has a configuration that allows the resilient portion 52 of the terminal to exert stress on the printed wiring board in such a way that the stress is distributed at a plurality of locations on the board. FIG. 3 is a perspective view of the metal terminal 50.

As shown in FIG. 3, the metal terminal 50 of the present embodiment includes the resilient portion 52 and a joining portion 54. The joining portion 54 is similar to the joining portion 12 of the metal terminal 10 of the first embodiment. Like the resilient portion 11 of the metal terminal 10 of the first embodiment, the resilient portion 52 includes a bridge portion and a curved portion (referred to as in the appended claims as a "first side portion" and a "second side portion," respectively). The bridge portion is the same as that of the metal terminal 10 of the first embodiment. The curved portion, however, differs from that of the metal terminal 10 in that it includes three strip portions defined and spaced by two slits that extend from the leading edge of the curved portion toward the bridge portion, as shown in FIG. 3.

In both the first and third embodiments the distance between the joining portion of the metal terminal and the closest point of the resilient portion of the metal terminal is (slightly) smaller than the combined thickness of the printed wiring board and the wiring pattern formed thereon. Therefore, when the printed wiring board is inserted between the resilient portion and the joining portion (as shown in FIG. 1C), the resilient portion causes slight stress on the printed wiring board. In the first embodiment, this stress may concentrate at a single location on the printed wiring board, since the entire resilient portion has a single wide strip shape (i.e., it has no slits). This may result in current concentration at that location and reduction of the contact area between the metal terminal and the wiring pattern on the printed wiring board.

The metal terminal 50 of the third embodiment is designed to avoid this problem. Specifically, since, as described above, the curved portion (or second side portion) of the resilient portion 52 has slits extending from its leading edge toward the bridge portion (or first side portion), the resilient portion 52 exerts stress on the printed wiring board in such a way that the stress is distributed at a plurality of locations on the board (i.e., not concentrated at a single location). This arrangement also increases the contact area between the resilient portion 52 and the printed wiring board, thereby preventing the current concentration described above.

Although the curved portion of the resilient portion 52 of the present embodiment has been described as including three strip portions defined by slits, it may include any suitable number of strip portions. Further, these slits may have any suitable shape that allows the resilient portion to exert stress on the printed wiring board in such a way that the stress is distributed at a plurality of locations on the board.

Figure 4A:
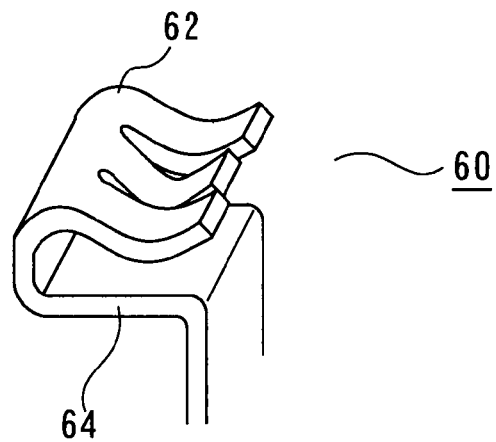
FIGS. 4A and 4B show a variation of the metal terminal.
Figure 4B:
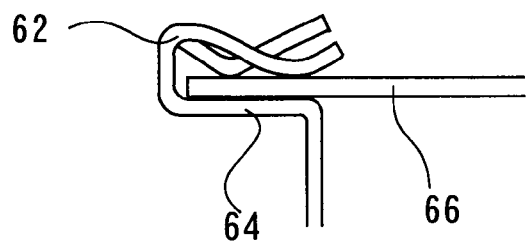

FIGS. 4A and 4B show a variation of the metal terminal 50 of FIG. 3 which has a configuration that allows the resilient portion of the terminal to exert stress on the printed wiring board in such a way that the stress is distributed at a plurality of locations on the board that are more spaced apart from each other than they are in the case of the metal terminal 50. Specifically, FIGS. 4A and 4B are a perspective view and a side view, respectively, of a metal terminal 60. The metal terminal 60 differs from the metal terminal 50 shown in FIG. 3 in that the three strip portions of the resilient portion 62 of the metal terminal 60 are curved such that the closest points on these strip portions to the joining portion 64 are not in a straight line, as shown in FIGS. 4A and 4B. That is, these closest points are spaced different distances from the bridge portion (i.e., the first side portion) of the resilient portion 62 to ensure that the resilient portion 62 exerts stress on the printed wiring board in such a way that the stress is distributed at a plurality of locations on the board that are more spaced apart from each other than they are in the case of the metal terminal 50 shown in FIG. 3.

It should be noted that the strip portions of the resilient portion 62 are not limited to the shapes shown in FIGS. 4A and 4B. They may have any suitable shape that allows the resilient portion 62 imposes stress on the printed wiring board in such a way that the stress is distributed at a plurality of locations on the board.

Fourth Embodiment

Figure 5A:
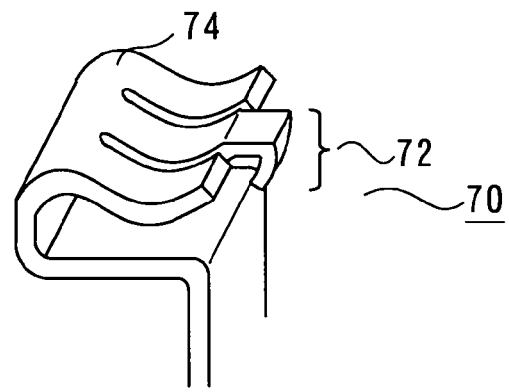
FIG. 5A is a perspective view of the metal terminal.

A fourth embodiment of the present invention relates to a semiconductor device which differs from that of the first embodiment in that it includes a metal terminal 70 and a printed wiring board 80 instead of the metal terminal 10 and the printed wiring board 34. The metal terminal 70 and the printed wiring board 80 have configurations that allow the printed wiring board 80 to be more firmly secured into the metal terminal 70 than the printed wiring board 34 is secured into the metal terminal 10. The fourth embodiment will be described with reference to FIGS. 5A and 5B. FIG. 5A is a perspective view of the metal terminal 70, and FIG. 5B is a side view of the metal terminal 70 and the printed wiring board 80.

The metal terminal 70 of the present embodiment includes a joining portion and a resilient portion 74. Like the resilient portion 52 of the metal terminal 50 of the third embodiment, the resilient portion 74 includes three strip portions defined by two slits, as shown in FIG. 5A. One of these strip portions has on its tip a hook 72 whose leading edge extends toward the joining portion, as shown in FIGS. 5A and 5B. Further, the printed wiring board 80 of the present embodiment has a hole 78 in which the hook 72 of the resilient portion 74 engages when the printed wiring board 80 is inserted into the metal terminal 70.

Figure 5B:
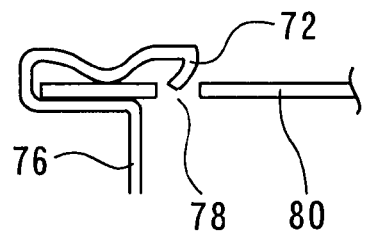
FIG. 5B is a side view of the metal terminal and the printed wiring board.

FIG. 5B shows the metal terminal 70 with the printed wiring board 80 fully inserted into it, i.e., with the hook 72 of the resilient portion 74 engaged in the hole 78 of the printed wiring board 80. This engagement prevents the printed wiring board 80 from coming loose from the metal terminal 70 due to an accidental force applied to them. Such an arrangement is especially advantageous when the wiring pattern on the printed wiring board 80 is not pressure-welded to the metal terminal 70 in order to allow disconnection of the board 80 from the terminal 70 as necessary. That is, in addition to the resilient compressive force exerted on the printed wiring board 80 by the metal terminal 70, the hook 72 serves to hold the board 80 in place.

Although the resilient portion of the metal terminal 70 of the present embodiment has been described as having slits, it will be understood that these slits may not be necessary. The present embodiment requires only that the metal terminal have a hook and the printed wiring board have a hole for engaging the hook. The hook may have any suitable shape and may be formed at any suitable place.

Fifth Embodiment

Figure 6A:
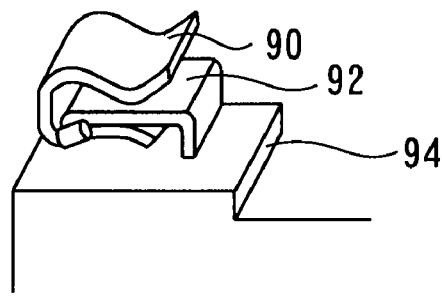
FIGS. 6A, 6B, 6C, and 6D show a terminal configuration of the fifth embodiment.

A fifth embodiment of the present invention relates to semiconductor devices which differ from that of the first embodiment in that they employ a different metal terminal instead of the metal terminal 10 to achieve improved electrical characteristics. It should be noted that only so much of the present embodiment will be described as necessary for an understanding of its features as compared to those of the first embodiment. The present embodiment will be first described with reference to FIGS. 6A, 6B, 6C, and 6D. These figures show a terminal configuration of the present embodiment. This terminal includes a resilient member 90 and a high conductivity member 92 that extends from within a module case 94, as shown in FIG. 6A.

Figure 6B:
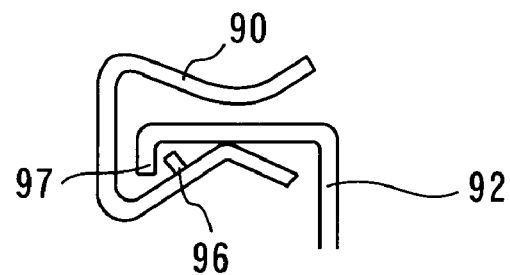
Figure 6C:
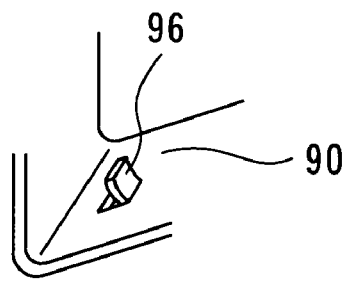

The resilient member 90 is made of a material having higher resilience than that of the high conductivity member 92 and has a U-shape. The parallelly extending sides of the resilient member 90 are inwardly convexed as shown in FIGS. 6A and 6B. Further, the resilient member 90 has a hook 96 that extends inwardly as shown in FIG. 6C.

The high conductivity member 92, on the other hand, is made of a material having higher electrical conductivity than that of the resilient member 90 and has on its leading edge a hook 97 that extends toward the module case 94.

The resilient member 90 is connected with the high conductivity member 92 such that the hook 96 of the resilient member 90 engages the hook 97 of the high conductivity member 92, as shown in FIG. 6B. It should be noted that the resilient member 90 is partially in contact with the module case 94.

As is known, it is difficult to increase the conductivity of a material having resilient properties (such as the material of the resilient member 90). As a result, generally the higher the resilience of a material, the lower its electrical conductivity. Therefore, it has been found that a metal terminal made of a resilient material (such as the metal terminal 10 of the first embodiment) must be increased in thickness to achieve sufficient electrical conductivity. Further, resilient material tends to degrade when subjected to heat treatment. This places a restriction on the temperature, etc. of the heat process in the manufacture of a semiconductor module having a metal terminal of a resilient material.

The above metal terminal of the present embodiment does not have these problems, since it includes both the resilient member 90 and the high conductivity member 92. That is, the resilient member 90 serves to secure the printed wiring board to the metal terminal by exerting its resilient force on the board. Further, the use of the high conductivity member 92 allows the metal terminal to have a reduced thickness (or cross section). Since, as described above, the high conductivity member 92 of the present embodiment is not formed of a resilient material, it does not degrade when heat treatment is performed in the manufacture of the semiconductor module. That is, the desired heat treatment can be performed when manufacturing the semiconductor module.

Further, as described above, the resilient member 90 is secured to the high conductivity member 92 such that the hook 96 of the resilient member 90 engages the hook 97 of the high conductivity member 92, thereby preventing the resilient member 90 from coming loose from the high conductivity member 92. Thus, the metal terminal of the present embodiment can be manufactured by a simple process while providing the advantages of the present invention.

Figure 6D:
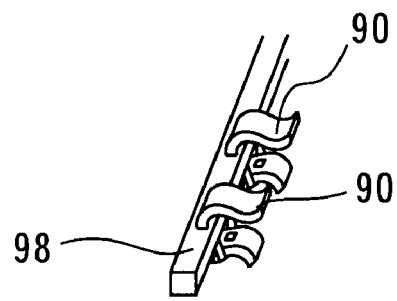

It should be noted that a plurality of the resilient members 90 may be interconnected by a coupling bar 98 of an insulating material, as shown in FIG. 6D, and collectively connected with the high conductivity member 92. This makes it easy to handle the resilient members 90 and secure them to the high conductivity member 92.

Figure 7:
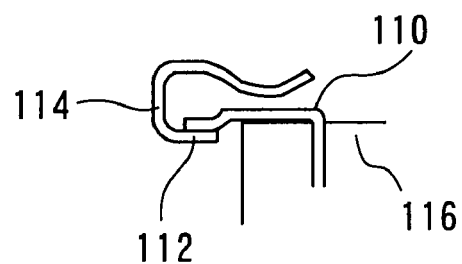
FIGS. 7-12 show another metal terminal configuration.

The present embodiment is not limited to the terminal configuration shown in FIGS. 6A, 6B, 6C, and 6D. FIG. 7 shows another metal terminal configuration. This terminal includes a high conductivity member 110 which extends from within a module case 116, and a resilient member 114. The leading end of the high conductivity member 110 is joined to one end of the resilient member 114 by an appropriate means such as welding so as to ensure sufficiently low contact resistance between them. The joined portion is indicated by reference numeral 112 in FIG. 7.

Figure 8:
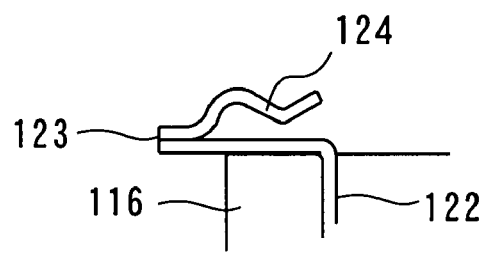

FIG. 8 shows still another metal terminal configuration. This terminal includes a high conductivity member 122 which extends from within a module case 116, and a resilient member 124. The leading end of the high conductivity member 122 is joined to one end of the resilient member 124. The joined portion is indicated by reference numeral 123 in FIG. 8.

Figure 9:
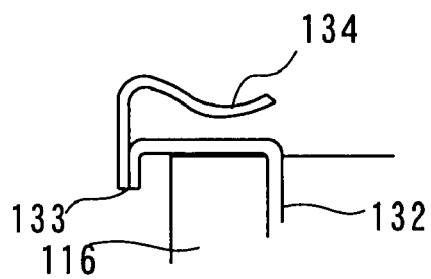

FIG. 9 shows still another metal terminal configuration. This terminal includes a high conductivity member 132 which extends from within a module case 116, and a resilient member 134. The leading end of the high conductivity member 132 is joined to one end of the resilient member 134. The joined portion is indicated by reference numeral 133 in FIG. 9.

Figure 10:
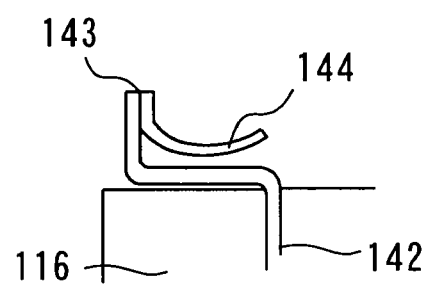

FIG. 10 shows still another metal terminal configuration. This terminal includes a high conductivity member 142 which extends from within a module case 116, and a resilient member 144. The leading end of the high conductivity member 142 is joined to one end of the resilient member 144. The joined portion is indicated by reference numeral 143 in FIG. 10.

Figure 11:
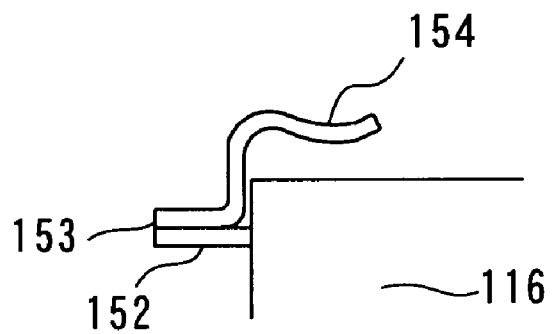

FIG. 11 shows still another metal terminal configuration. This terminal includes a high conductivity member 152 which extends from within a module case 116, and a resilient member 154. The leading end of the high conductivity member 152 is joined to one end of the resilient member 154 such that the resilient member 154 overhangs the module case 116, as shown in FIG. 11. (The joined portion is indicated by reference numeral 153 in FIG. 11.) With this arrangement, the printed wiring board is inserted and clamped between the resilient member 154 and the module case 116. This eliminates the need for the high conductivity member 152 to be constructed to be mounted in surface contact with the module case 116, thereby simplifying the manufacturing process of the semiconductor device.

Figure 12:
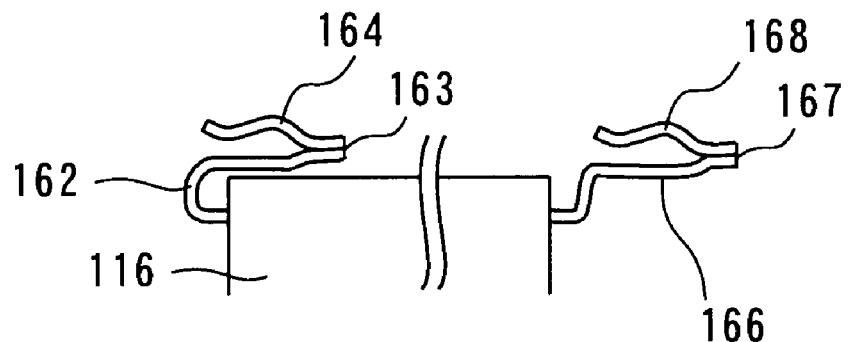

FIG. 12 shows still another metal terminal configuration, which includes two metal terminals. A first terminal includes a high conductivity member 162 which extends from within a module case 16, and a resilient member 164. The leading end of the high conductivity member 162 is joined to one end of the resilient member 164. The joined portion is indicated by reference numeral 163 in FIG. 12. A second terminal, on the other hand, includes a high conductivity member 166 which extends from within the module case 116, and a resilient member 168. The leading end of the high conductivity member 166 is joined to one end of the resilient member 168. The joined portion is indicated by reference numeral 167 in FIG. 12. It should be noted that in each of the terminals shown in FIGS. 8 to 12 the leading end of the high conductivity terminal is joined to one end of the resilient member such that they extend or face in the same direction. This allows for accurate joining of these ends. It will be understood that the present embodiment is not limited to the terminal configurations described above, and various alterations may be made thereto without departing from the spirit and scope of the invention.

Sixth Embodiment

Figure 13:
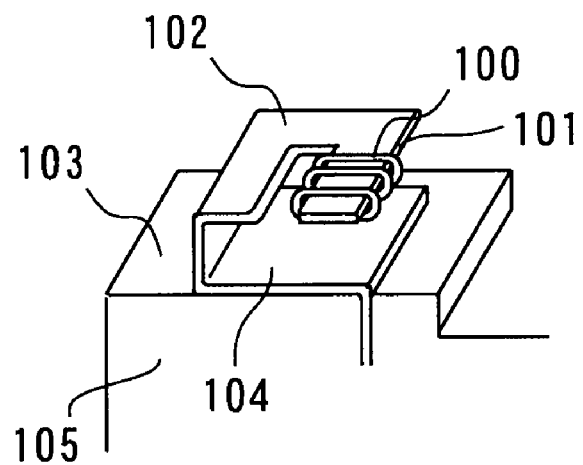
FIG. 13 is a diagram illustrating the configuration of terminal according to the sixth embodiment.

A sixth embodiment of the present invention relates to a semiconductor device which differs from that of the first embodiment in that it includes a different metal terminal instead of the metal terminal 10. It should be noted that only so much of the present embodiment will be described as necessary for an understanding of its features as compared to those of the first embodiment. The present embodiment will now be described with reference to FIG. 13. The metal terminal of the present embodiment includes a joining portion 104 and a resilient portion 102. The joining portion 104 extends from a module case 105, and the resilient portion 102 extends from the joining portion 104. The resilient portion 102 includes a flat plate-like portion extending parallel to and spaced a predetermined distance from the joining portion 104. The resilient portion 102 also includes a portion extending perpendicularly from the joining portion 104 and bridging between the joining portion 104 and the plate-like portion. The plate-like portion of the resilient portion 102 has a slit extending from one of its parallel edges toward the other opposing edge, thereby defining a strip portion 101, as shown in FIG. 13. Further, according to the present embodiment, a spring member 100 is attached to this strip portion 101.

Inserting the printed wiring board into the metal terminal results in the board being clamped between the spring member 100 and the joining portion 104 of the terminal. The use of the spring member 100 (which serves to exert resilient force on the printed wiring board) eliminates the need for the other portions of the metal terminal to be formed of a resilient material. This means that these portions (i.e., the joining portion 104, the resilient portion 102, etc.) can be made of a material having sufficient electrical conductivity, resulting in improved characteristics of the semiconductor device.

According to the present embodiment, the spring member 100 may be a cylindrical spring or coil spring. Alternatively, a spring material may be wound around the strip portion 101 using a winder. Further, whether or not to pressure-weld the printed wiring board to the metal terminal depends on the degree of firmness or strength with which the board is to be held in the terminal.

Seventh Embodiment

Figure 14A:
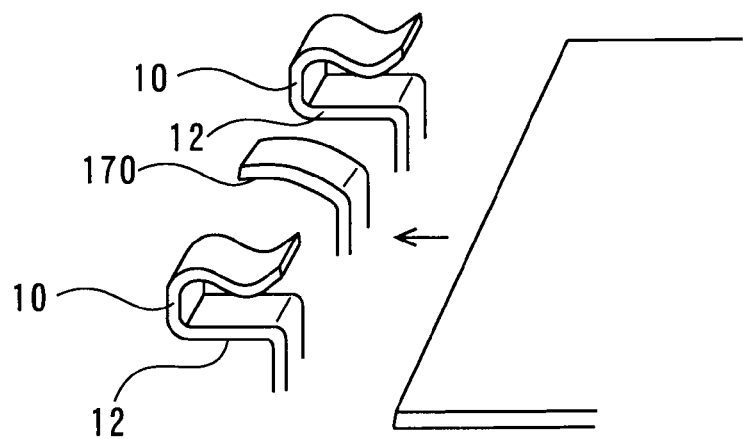
FIGS. 14A and 14B are diagrams illustrating the terminal and a printed wiring board according to the seventh embodiment.
Figure 14B:
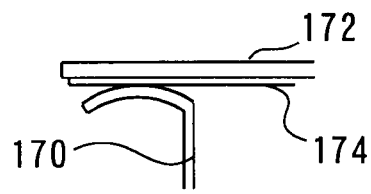

A seventh embodiment of the present invention relates to a semiconductor device which differs from that of the first embodiment in that it additionally includes a second metal terminal 170 which is designed to carry a small current. It should be noted that only so much of the present embodiment will be described as necessary for an understanding of its features as compared to those of the first embodiment. The present embodiment will now be described with reference to FIGS. 14A and 14B. As shown in FIG. 14A, the second metal terminal 170 extends from within a module case 171 and includes a curved portion. This curved portion of the second metal terminal 170 comes into contact with a wiring pattern 174 on a printed wiring board 172 when the board 172 is secured in place on the semiconductor module, as shown in FIG. 14B.

Unlike the metal terminal 10, the second metal terminal 170 does not serve to fix the printed wiring board 172. That is, this terminal 170 is not in as much close contact with the board 172 as is the metal terminal 10. It should be noted that not all metal terminals of the semiconductor device carry a large current. Further, some metal terminals (which are brought into contact with metal electrodes or patterns on the printed wiring board) need not be adapted to fix the board. That is, it is not economical to design all the metal terminals to have the same configuration as the metal terminal 10. Such an arrangement also complicates the manufacturing process. In order to avoid this, terminals carrying a relatively small current such as control terminals and sensor terminals may have the same configuration as the second metal terminal 70 to simplify the structure of the semiconductor device and hence its manufacturing process.

Eighth Embodiment

Figure 15:
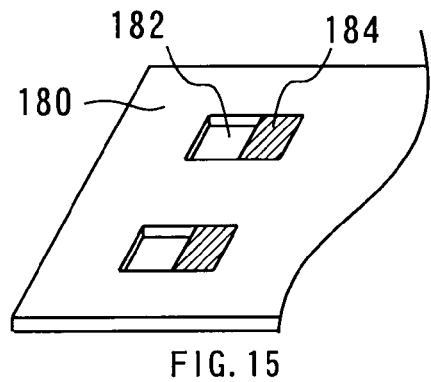
FIG. 15 shows a printed wiring board of the eighth embodiment.
Figure 16:
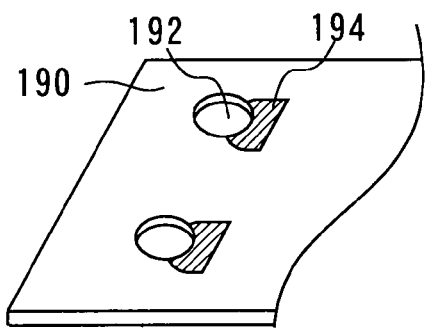
FIG. 16 shows another printed wiring board of the eighth embodiment.

An eighth embodiment of the present invention relates to semiconductor devices which differ from that of the first embodiment in that they employ a different printed wiring board instead of the printed wiring board 34 in order to increase the layout flexibility of the semiconductor module. It should be noted that only so much of the present embodiment will be described as necessary for an understanding of its features as compared to those of the first embodiment. The present embodiment will now be described with reference to FIGS. 15 and 16. FIG. 15 shows a printed wiring board 180 of the present embodiment. This printed wiring board has square holes 182 and wiring patterns 184 formed adjacent the square holes 182, as shown in FIG. 15. FIG. 16, on the other hand, shows a printed wiring board 190 of the present embodiment. This printed wiring board has round holes 192 and wiring patterns 194 formed adjacent the round holes 192, as shown in FIG. 16. It should be noted that the square holes 182 and the round holes 192 are formed in the center portions (not edge portions) of their respective printed wiring boards.

In a conventional printed wiring board, each wiring pattern to be connected to an external metal terminal is usually formed on the periphery of the board. In the printed wiring boards of the present embodiment, on the other hand, such wiring patterns are formed on the center portions of the boards and holes are formed adjacent the wiring patterns, as described above. With this arrangement, the external metal terminals (extending from the semiconductor module) are connected to the wiring patterns through the holes, resulting in greater layout flexibility of the semiconductor module. The square holes 182 shown in FIG. 15 may be disadvantageous in that great stress may be induced at the corners of the holes when the printed wiring board is fixed. The round holes 192 shown in FIG. 16, on the other hand, are less prone to such problems.

Thus, the present invention provides semiconductor devices in which a semiconductor module and a separate printed wiring board are interconnected by simple interconnection means so as to provide improved characteristics.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-319794, filed on Dec. 11, 2007 including specification, claims, drawings and summary, on which the Convention priority of the present application is based, are incorporated herein by reference in its entirety.

What is claimed is:

1. A semiconductor device comprising:
   a semiconductor module case;
   a metal terminal externally extending from within said case;
   a semiconductor element disposed within said case and electrically connected to said metal terminal; and
   a printed wiring board having a wiring pattern formed on a surface thereof, said printed wiring board being connected to said semiconductor element through said metal terminal;
   wherein the external portion of said metal terminal includes a joining portion and a resilient portion, said joining portion being in surface contact with an external surface of said case, and said resilient portion facing and being spaced from said joining portion;
   wherein said printed wiring board is inserted between said joining portion and said resilient portion; and
   wherein said wiring pattern on said printed wiring board is pressure-welded to said joining portion.

2. The semiconductor device as claimed in claim 1, wherein:
   said resilient portion includes a first side portion and a second side portion;
   said first side portion bridges between said joining portion and said second side portion; and
   said second side portion faces said joining portion and is convexly curved toward said joining portion.

3. The semiconductor device as claimed in claim 2, wherein:
   said resilient portion includes a first strip portion and a second strip portion; and
   said first and second strip portions are defined and spaced by a slit formed in said second side portion such that said slit extends from a leading edge of said second side portion toward said first side portion.

4. The semiconductor device as claimed in claim 3, wherein the closest point of said first strip portion to said joining portion and the closest point of said second strip portion to said joining portion are not equally spaced from said first side portion.

5. The semiconductor device as claimed in claim 3, wherein:
said printed wiring board has a hole formed therein;
said first strip portion has a hook formed on its tip; and
said hook of said first strip portion engages said hole of said printed wiring board.

6. The semiconductor device as claimed in claim 1, wherein:
said external portion of said metal terminal is made up of a single flat metal plate; and
said joining portion and said resilient portion are defined and spaced by a notch formed in said metal plate.

7. The semiconductor device as claimed in claim 1, wherein said resilient portion of said metal terminal is made of a material having lower electrical conductivity than that of the other portions of said metal terminal.

8. The semiconductor device as claimed in claim 7, wherein:
said resilient portion has a first hook formed thereon;
said joining portion has a second hook formed thereon; and
said resilient portion is connected with said joining portion by engaging said first hook with said second hook.

9. The semiconductor device as claimed in claim 1, wherein:
said resilient portion includes a flat plate-like portion;
a spring material is attached to a part of said flat plate-like portion; and
said printed wiring board is inserted between said joining portion and said spring material.

10. The semiconductor device as claimed in claim 1, further comprising:
a second metal terminal externally extending from within said case;
wherein said semiconductor element is electrically connected to said second metal terminal;
wherein said printed wiring board has a second wiring pattern formed on a surface thereof; and
wherein the external portion of said second metal terminal is in contact with said second wiring pattern.

11. The semiconductor device as claimed in claim 1, wherein:
said printed wiring board has a hole formed therein; and
said external portion of said metal terminal penetrates through said hole.

12. A semiconductor device comprising:
a semiconductor module case;
a metal terminal externally extending from within said case;
a semiconductor element disposed within said case and electrically connected to said metal terminal; and
a printed wiring board having a wiring pattern formed on a surface thereof, said printed wiring board being connected to said semiconductor element through said metal terminal;
wherein the external portion of said metal terminal includes a resilient portion that faces and is spaced from said case;
wherein said printed wiring board is inserted between said resilient portion and said case; and
wherein said wiring pattern on said printed wiring board is pressure-welded to said resilient portion.

* * * * *